United States Patent
Chen et al.

(10) Patent No.: US 9,713,288 B2
(45) Date of Patent: Jul. 18, 2017

(54) TEMPERATURE ADJUSTING APPARATUS FOR SERVER AND METHOD THEREOF

(71) Applicant: Acer Incorporated, New Taipei (TW)

(72) Inventors: Chien-Pang Chen, New Taipei (TW); I-Huei Huang, New Taipei (TW)

(73) Assignee: Acer Incorporated, New Taipei (TW)

( * ) Notice: Subject to any disclaimer, the term of this patent is extended or adjusted under 35 U.S.C. 154(b) by 620 days.

(21) Appl. No.: 14/140,473

(22) Filed: Dec. 25, 2013

(65) Prior Publication Data
US 2015/0099449 A1 Apr. 9, 2015

(30) Foreign Application Priority Data
Oct. 4, 2013 (TW) .............................. 102136051 A

(51) Int. Cl.
*H05K 5/00* (2006.01)
*H05K 7/20* (2006.01)

(52) U.S. Cl.
CPC ..... *H05K 7/20736* (2013.01); *H05K 7/20836* (2013.01)

(58) Field of Classification Search
CPC .............. H05K 7/20736; H05K 7/20836
USPC ......................................... 454/184
See application file for complete search history.

(56) References Cited

U.S. PATENT DOCUMENTS

| 2002/0029912 A1* | 3/2002 | MacKelvie | ............ B60K 11/00 180/68.1 |
| 2011/0281516 A1* | 11/2011 | Newcomer | ............. F24F 3/044 454/231 |

FOREIGN PATENT DOCUMENTS

| CN | 101008855 | 8/2007 | |
| CN | 101520683 | 9/2009 | |
| CN | 102129278 | 7/2011 | |
| CN | 102458084 | 5/2012 | |
| CN | 202468388 | 10/2012 | |
| JP | H08-201917 | 8/1996 | |
| JP | 2009181250 | 8/2009 | |
| JP | GB 2470477 A | * 11/2010 | ............... G06F 1/20 |
| TW | 201216607 | 4/2012 | |
| TW | 201218933 | 5/2012 | |
| TW | 201225824 | 6/2012 | |

* cited by examiner

*Primary Examiner* — Helena Kosanovic
(74) *Attorney, Agent, or Firm* — Jianq Chyun IP Office

(57) ABSTRACT

A temperature adjusting apparatus for a server and a temperature adjusting method thereof are provided. Rotation speeds and rotation directions of fans are controlled according to sensing results of temperature sensors, so as to adjust temperatures of server units by heat generated from the server units during operation.

4 Claims, 4 Drawing Sheets

TEMPERATURE ADJUSTING APPARATUS FOR SERVER AND METHOD THEREOF

CROSS-REFERENCE TO RELATED APPLICATION

This application claims the priority benefit of Taiwan application serial no. 102136051, filed on Oct. 4, 2013. The entirety of the above-mentioned patent application is hereby incorporated by reference herein and made a part of this specification.

BACKGROUND OF THE INVENTION

1. Field of the Invention

The present invention generally relates to a temperature adjusting apparatus and a temperature adjusting method thereof, and in particular relates to a temperature adjusting apparatus for a server and a temperature adjusting method thereof.

2. Description of Related Art

People live in high-latitude countries often experience temperature under zero degree Celsius. However, the internal chips in electronic devices nowadays are operable only at 5° C. or above. A few power transistors may run properly at −5° C. but their unit prices are relatively higher.

Under current specification of TIA-942, the temperature of data rooms where servers are placed needs to be kept within the range of 18° C. to 27° C. However, only large corporations can afford such equipment. For small companies, servers are usually placed in offices to save the costs. In high-latitude countries, the room temperature may be below 0° C. in the evening when air-conditioners are not running, which results in that the servers do not operate properly. Thus, heaters are required to run for a long period of time in order to keep the servers working properly. However, running the heaters all night for the entire room is a waste of energy and not environmental friendly.

SUMMARY OF THE INVENTION

The invention provides a temperature adjusting apparatus for a server and a temperature adjusting method thereof for saving the costs of adjusting server temperature.

The temperature adjusting apparatus for the server provided by the invention includes a case, a frame, a plurality of temperature sensors, a plurality of fans and a control unit. The case includes at least an air inlet and at least an air outlet. The frame is disposed in the case to accommodate a plurality of server units. The plurality of temperature sensors are disposed on a side of the frame, which is close to the air inlet, corresponding to positions of the server units for sensing temperature. The plurality of fans are disposed on a side of the frame, which is close to the air outlet, corresponding to the positions of the server units. The control unit is coupled to the plurality of temperature sensors and the plurality of fans, and controls a rotation speed and a rotation direction of each of the fans according to sensing results from the temperature sensors.

In one embodiment of the invention, when the fans are controlled by the control unit to rotate in a first direction, the fans generate an air flow flowing from the air outlet to the air inlet to increase the temperatures of the server units. When the fans are controlled by the control unit to rotate in a second direction, the fans generate an air flow flowing from the air inlet to the air outlet to reduce the temperatures of the server units.

In one embodiment of the invention, the control unit further determines whether the temperatures sensed by the temperature sensors are less than a first preset temperature. If any of the temperatures sensed by the temperature sensors is less than the first preset temperature, the control unit controls the fans corresponding to the temperature sensors that sense the temperatures less than the first preset temperature to rotate in the first direction.

In one embodiment of the invention, the control unit further determines whether the temperatures sensed by the temperature sensors are greater than a second preset temperature. If the temperatures sensed by the temperature sensors are greater than the second preset temperature, the control unit stops adjusting the rotation speed and the rotation direction of the fans, wherein the second preset temperature is greater than the first preset temperature.

In one embodiment of the invention, the control unit further determines whether the temperatures sensed by the temperature sensors are less than a third preset temperature and greater than the first preset temperature. If the temperatures sensed by the temperature sensors are less than the third preset temperature and greater than the first preset temperature, the control unit maintains the fan to rotate at a low speed, wherein the third preset temperature is less than the second preset temperature.

In one embodiment of the invention, the aforementioned temperature adjusting apparatus for the server further includes a valve disposed at the air outlet. The control unit further determines whether the temperatures sensed by the temperature sensors are less than a threshold temperature. If the temperatures sensed by the temperature sensors are less than the threshold temperature, the control unit closes the valve, wherein the threshold temperature is less than or equal to the first preset temperature.

In one embodiment of the invention, a first air circulation space is formed between the frame and the air inlet and a second air circulation space is formed between the frame and the air outlet.

The invention provides a temperature adjusting method for the temperature adjusting apparatus for the server, wherein the temperature adjusting apparatus includes a plurality of temperature sensors and a plurality of fans, and the temperature adjusting method includes the following steps. Sensing temperatures of a plurality of server units by the plurality of temperature sensors. Controlling a rotation speed and a rotation direction of each of the plurality of fans according to sensing results of the plurality of temperature sensors, wherein the temperatures of the plurality of server units increase when the plurality of fans rotate in a first direction, and the temperatures of the plurality of server units decrease when the plurality of fans rotate in a second direction.

In one embodiment of the invention, the step of controlling the rotation speed and the rotation direction of the fans according to the sensing results of the temperature sensors includes the following steps. Determining whether the temperatures sensed by the plurality of temperature sensors are less than a first preset temperature. Controlling the fans corresponding to the temperature sensors that sense the temperatures less than the first preset temperature to rotate in the first direction if any of the temperatures sensed by the plurality of temperature sensors is less than the first preset temperature. Determining whether the temperatures sensed by the plurality of temperature sensors are greater than a second preset temperature if the temperatures sensed by the plurality of temperature sensors are not less than the first preset temperature. Stopping adjusting the rotation speed and the rotation direction of the plurality of fans if the temperatures sensed by the plurality of temperature sensors are greater than the second preset temperature, wherein the second preset temperature is greater than the first preset temperature.

In one embodiment of the invention, the step of controlling the rotation speed and the rotation direction of each of the fans according to the sensing results of the temperature sensors further includes the following steps. determining whether the temperatures sensed by the plurality of temperature sensors are less than a third preset temperature and greater than the first preset temperature, and maintaining the plurality of fans to rotate at a low speed if the temperatures sensed by the plurality of temperature sensors are less than the third preset temperature and greater than the first preset temperature, wherein the third preset temperature is less than the second preset temperature.

Based on the above, the invention controls the rotation speed and the rotation direction of the fans according to the sensing results from the temperature sensors, and maintains the temperatures of the server units within a normal operable range by heat generated by the server units during operation. Thus, the costs of installing or using heat sources are saved.

Several exemplary embodiments accompanied with figures are described below in detail to further explain the disclosure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
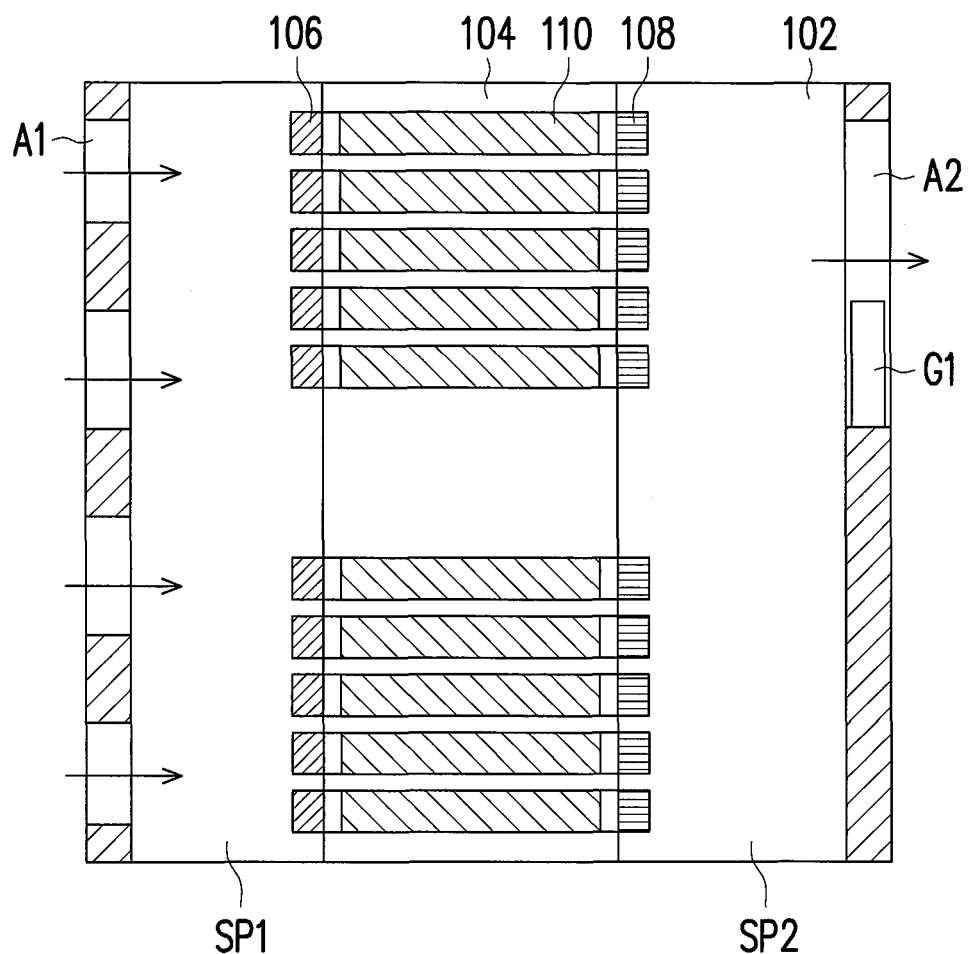
FIG. 1 is a schematic diagram illustrating a temperature adjusting apparatus for a server according to one embodiment of the invention.

Reference will now be made in detail to the exemplary embodiments of the invention, examples of which are illustrated in the accompanying drawings. Wherever possible, the same reference numbers are used in the drawings and the description to refer to the same or like parts.

FIG. 1 is a schematic diagram illustrating a temperature adjusting apparatus for a server according to one embodiment of the invention. Referring to FIG. 1, the temperature adjusting apparatus for the server includes a case 102, a frame 104, a plurality of temperature sensors 106, a plurality of fans 108, and a control unit (not shown). The case 102 has a plurality of air inlets A1 and an air outlet A2. The air inlets A1 and the air outlet A2 are disposed at different sides of the case 102. For example, in FIG. 1, the air inlets A1 and the air outlet A2 are located at opposite sides of the case 102, and the air outlet A2 is located at a top portion of the case 102. The frame 104 is disposed in the case 102. An air circulation space SP1 is formed between the frame 104 and the air inlets A1, and an air circulation space SP2 is formed between the frame 104 and the air outlet A2. The frame 104 is used for accommodating a plurality of server units 110. The temperature sensors 106 are disposed on a side of the frame 104, which is closer to the air inlets A1, corresponding to the positions of the server units 110. The fans 108 are disposed on a side of the frame 104, which is closer to the air outlet A2, corresponding to the positions of the server units 110. It should be noted that the numbers of the aforementioned air inlets A1 and the aforementioned air outlet A2 are for illustrating an exemplary embodiment only, and the invention is not limited thereto. The numbers of the air inlets A1 and the air outlet A2 may be increased or reduced for the actual application.

In addition, the control unit is coupled to the plurality of temperature sensors 106 and the plurality of fans 108. The control unit may control a rotation direction of each fan 108 according to a sensing result from the temperature sensor 106 so as to adjust a temperature of each server unit 110, so that the server unit 110 may operate at an appropriate temperature. In detail, each fan 108 may rotate in a first direction or a second direction. When the fan 108 rotates in the second direction, the heat generated by the server unit 110 during operation may be exhausted from the air outlet A2, and at the same time the air outside of the case 102 may be sucked in from the air inlet A1. The server unit 110 is cooled down by the air flow flowing from the air inlet A1 to the air outlet A1 which takes away the heat. When the fan 108 rotates in the first direction, the heat generated by the server unit 110 during operation is brought back to the server unit 110, which means the temperature of the server unit 110 is raised by the air flow flowing from the air outlet A2 to the air inlet A1 which brings the heat back to the server unit 110. In this way, the temperature of the server unit 110 is kept from being too low due to the cold air outside the case 102, and abnormal operation is prevented.

By using the fan 108 to guide the heat generated by the server unit 110 during operation, it is not needed to dispose heat sources in the surroundings of the server when the server is used in cold weather at high latitudes. The temperature of the server unit 110 is increased by the heat generated by the server unit 110 during operation, so that the increase in the cost of the equipment is prevented.

Further, when the control unit determines the rotation direction of each fan 108, the control unit may for example determine whether the temperature of the server unit 110 is less than a first preset temperature (e.g. 5° C.) according to the temperature sensed by the temperature sensor 106 corresponding to the fan 108, wherein a second preset temperature is greater than the first preset temperature. If the temperature sensed by the temperature sensor 106 is less than the first preset temperature, the control unit controls the fan 108 corresponding to the temperature sensor 106 that senses the temperature less than the first preset temperature to rotate in the first direction, so that the temperature of the server unit 110 is increased. In contrast, if the control unit determines that the temperature of the server unit 110 is not less than the first preset temperature, then the control unit determines whether the temperature of the server unit 110 is greater than the second preset temperature (e.g. 15° C.). If the temperature of the server unit 110 is greater than the second preset temperature, which means the temperature of the server unit 110 reaches a normal operation temperature, the control unit may stop adjusting the rotation speed and the rotation direction of the fan 108.

In some embodiments, the control unit may first determine whether the temperature of the server unit 110 is less than a third preset temperature (e.g. 8° C.) and greater than the first preset temperature (e.g. 5° C.), wherein the third preset temperature is less than the second preset temperature. If the control unit determines that the temperature of the server unit 110 is less than the third preset temperature and greater than the first preset temperature, the control unit first controls the fan 108 to rotate at a low speed and then performs the aforementioned adjustment of the rotation speed and the rotation direction of the fan 108 after the fan 108 is pre-heated.

In addition, the temperature adjusting apparatus for the server may further include a valve G1 disposed at the air outlet A2, as illustrated in FIG. 1. The valve G1 is controlled to open or close by the control unit. The control unit may determine whether the temperature sensed by the temperature sensor is too low, for example, less than a threshold temperature (e.g. less than 0° C.). When the control unit determines that the temperature sensed by the temperature sensor is less than the threshold temperature, the control unit may close the valve G1, so as to prevent outflow of the heat generated by the server unit 110, thereby raising the temperature of the server unit 110 more rapidly. When the temperature of the server unit 110 is raised to a certain temperature (e.g. the first preset temperature, the second preset temperature or the third preset temperature), the valve G1 is opened by the control unit.

It is noted that the aforementioned server units 110 may include servers with different functionalities or specifications. Servers with different functionalities or specifications require different energy to adjust the temperatures thereof. Therefore, the control unit not only adjusts the rotation speed and the rotation direction of each fan 108 according to the sensing result from each temperature sensor 106, but also determines the rotation speed of the fan 108 according to the functionalities or specification of each server unit 110. Adjusting the temperature of the server unit 110 according to the characteristics of each server unit 110 increases the efficiency of temperature adjustment.

Figure 2:
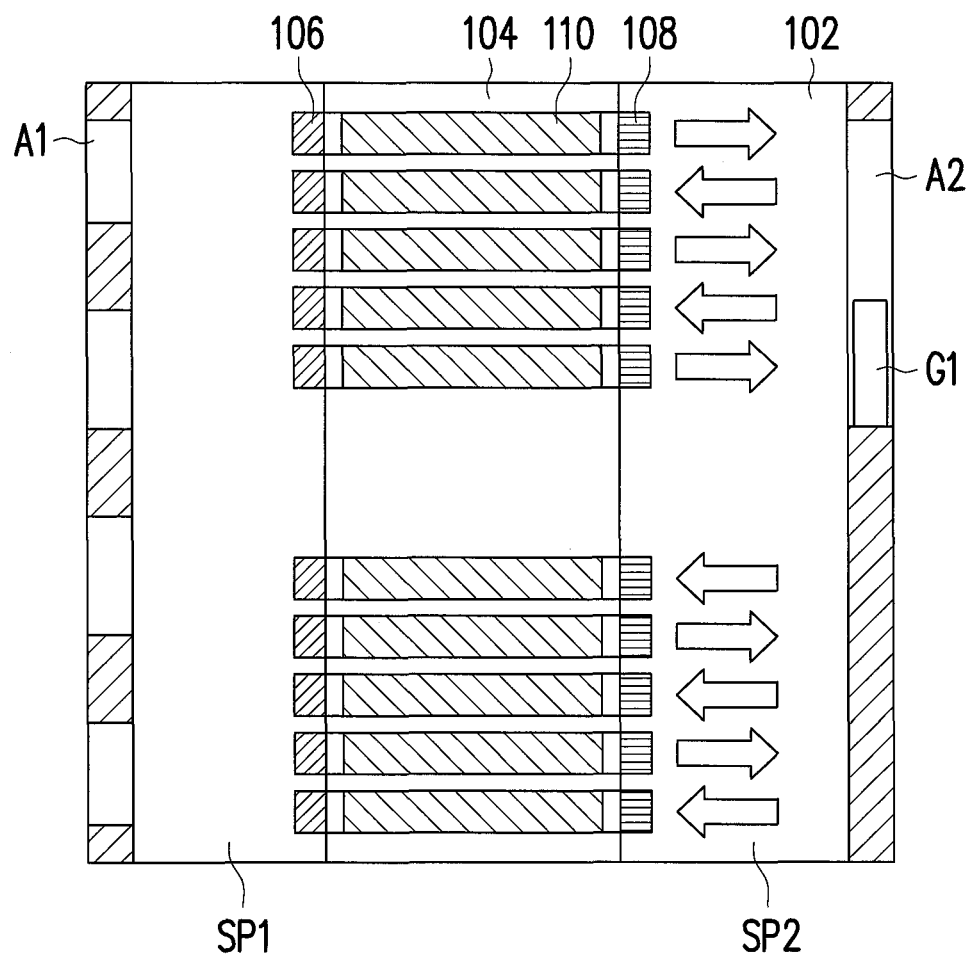
FIG. 2 is a schematic diagram illustrating a temperature adjusting apparatus for a server according to another embodiment of the invention.

In addition, in order to unify the temperatures of the server units 110, the rotation direction of each fan 108 may be adjusted according to the application circumstance. The temperatures of the server units 110 may be unified by controlling the direction of the air flow. For example, FIG. 2 is a schematic diagram illustrating a temperature adjusting apparatus for a server according to another embodiment of the invention. As illustrated in FIG. 2, the rotation directions of the adjacent fans may be opposite to each other so as to unify the temperatures of the server units and prevent condensation due to an excessive difference in temperature between server units 110 in different locations.

Figure 3:
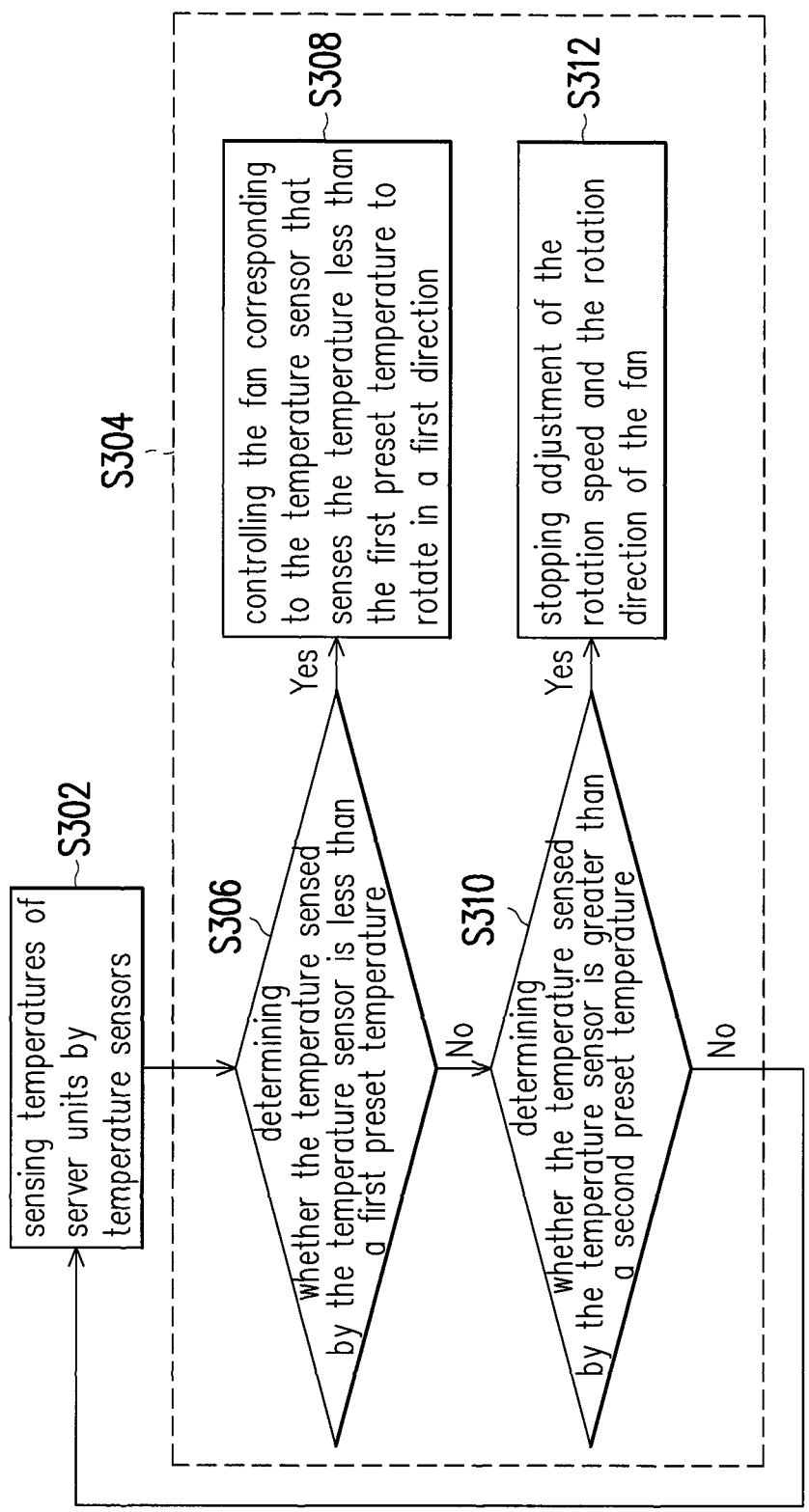
FIG. 3 is a flow chart illustrating a temperature adjusting method of a temperature adjusting apparatus for a server according to one embodiment of the invention.

FIG. 3 is a flow chart illustrating a temperature adjusting method of a temperature adjusting apparatus for a server according to one embodiment of the invention. Referring to FIG. 3, the temperature adjusting method of the aforementioned temperature adjusting apparatus for the server may include the following steps. First, sensing temperatures of a plurality of server units by the plurality of temperature sensors (step S302). Next, controlling a rotation speed and a rotation direction of each of the plurality of fans according to sensing results of the plurality of temperature sensors (step S304), wherein the temperature of the server unit increases when the fan rotates in a first direction, and the temperature of the server unit decreases when the fan rotates in a second direction. In detail, the step of controlling the rotation speed and the rotation direction of the fan according to the sensing result of the temperature sensor may include: first, determining whether the temperature sensed by the temperature sensor is less then a first preset temperature (step S306); and if the temperature sensed by any of the temperature sensors is less than the first preset temperature, controlling the fan corresponding to the temperature sensor that senses the temperature less than the first preset temperature to rotate in the first direction (step S308). In contrast, if the temperature sensed by the temperature sensor is not less than the first preset temperature, then determining whether the temperature sensed by the temperature sensor is greater than a second preset temperature (step S310), wherein the second preset temperature is greater than the first preset temperature. If the temperature sensed by the temperature sensor is greater than the second preset temperature, then stopping adjusting the rotation speed and the rotation direction of the fan (step S312), and if the temperature sensed by the temperature sensor is not greater than the second preset temperature, then the method returns to step S302 to continue sensing the temperature of the server unit.

Figure 4:
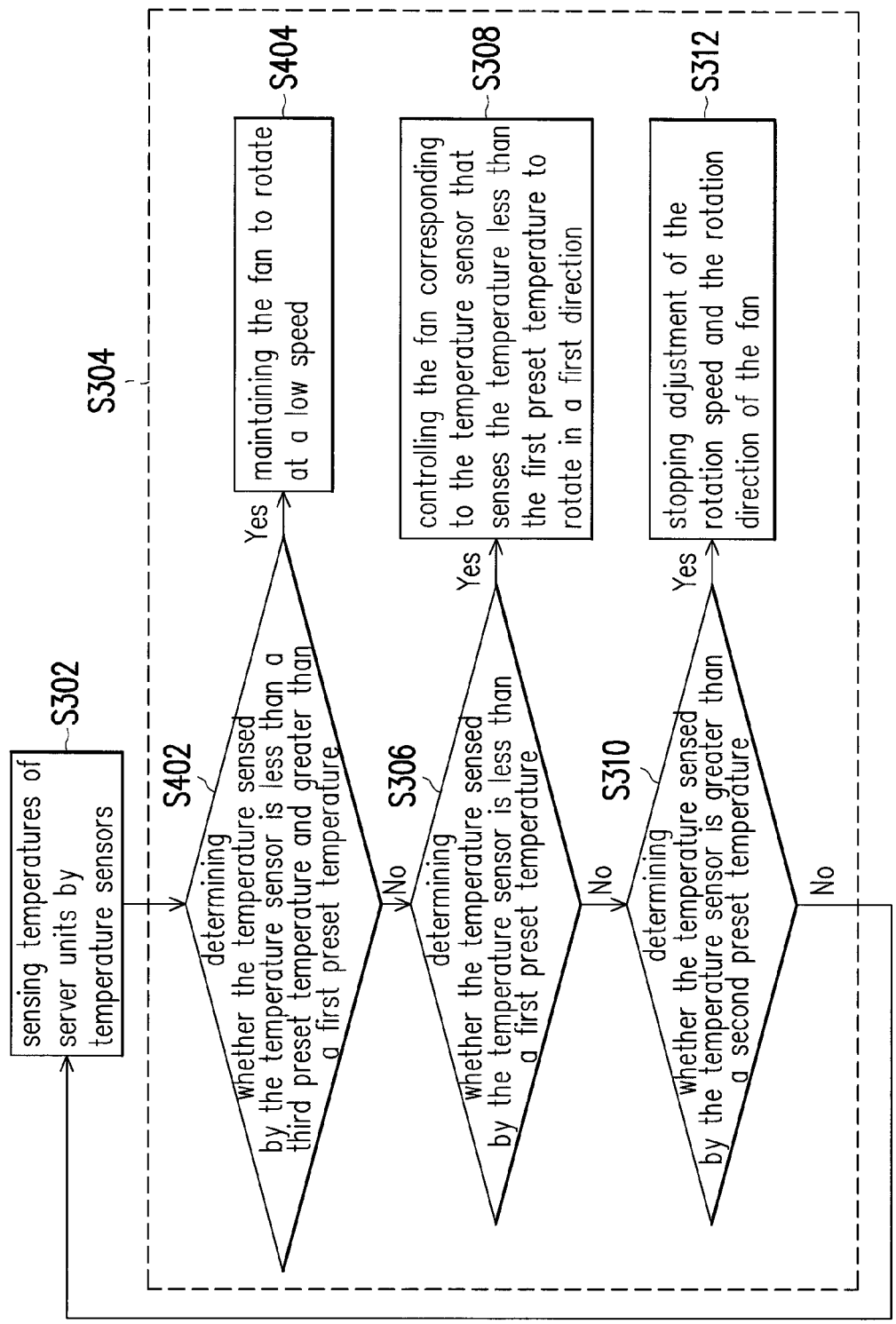
FIG. 4 is a flow chart illustrating a temperature adjusting method of a temperature adjusting apparatus for a server according to another embodiment of the invention.

FIG. 4 is a flow chart illustrating a temperature adjusting method of a temperature adjusting apparatus for a server according to another embodiment of the invention. Referring to FIG. 4, the difference between the temperature adjusting method of the temperature adjusting apparatus for the server provided by the present embodiment and the one provided by the embodiment in FIG. 3 is that: in the present embodiment, before determining whether the temperature sensed by the temperature sensor is less than the first preset temperature (step S306), whether the temperature sensed by the temperature sensor is less than the third preset temperature and greater than the first preset temperature is further determined (step S402), wherein the third preset temperature is less than the second preset temperature. If the temperature sensed by the temperature sensor is less than the third preset temperature and greater than the first preset temperature, then the fan is maintained to rotate at a low speed (step S404), and the method returns to step S302 to continue sensing the temperature of the server unit, so as to pre-heat the fan and observe the temperature of the server unit. If the temperature sensed by the temperature sensor is not less than the third preset temperature and greater than the first preset temperature, then the method moves on to step S306 to continue to perform the adjustment of the rotation speed and the rotation direction of the fan.

In conclusion, the invention controls the rotation speed and the rotation direction of the fan according to the sensing result from the temperature sensor, and utilizes the heat generated by the server unit during operation to maintain the temperature of the server unit within a normal operable range. Thus, the costs of installing or using heat sources (e.g. heating machines or heaters) are saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A temperature adjusting apparatus for a server, the temperature adjusting apparatus comprising:
    a case, having at least an air inlet and at least an air outlet;
    a frame, disposed in the case to accommodate a plurality of server units;

a plurality of temperature sensors, disposed on a side of the frame, which is close to the air inlet, corresponding to positions of the plurality of server units to sense temperatures;

a plurality of fans, disposed on a side of the frame, which is close to the air outlet, corresponding to the positions of the plurality of server units; and a control unit, coupled to the plurality of temperature sensors and the plurality of fans and controlling a rotation speed and a rotation direction of each of the plurality of fans according to sensing results of the plurality of temperature sensors, wherein the control unit further determines whether the temperatures sensed by the plurality of temperature sensors are less than a first preset temperature, and if any of the temperatures sensed by the plurality of temperature sensors is less than the first preset temperature, the control unit controls the fans corresponding to the temperature sensors that sense the temperatures less than the first preset temperature to rotate in the first direction, the control unit further determines whether the temperatures sensed by the plurality of temperature sensors are greater than a second preset temperature, and if the temperatures sensed by the plurality of temperature sensors are greater than the second preset temperature, the control unit stops adjusting the rotation speed and the rotation direction of the plurality of fans, wherein the second preset temperature is greater than the first preset temperature, wherein when the plurality of fans are controlled by the control unit to rotate in a first direction, the plurality of fans generate an air flow flowing from the air outlet to the air inlet to increase the temperatures of the plurality of server units, and when the plurality of fans are controlled by the control unit to rotate in a second direction, the plurality of fans generate an air flow flowing from the air inlet to the air outlet to reduce the temperatures of the plurality of server units.

2. The temperature adjusting apparatus according to claim 1, wherein the control unit further determines whether the temperatures sensed by the plurality of temperature sensors are less than a third preset temperature and greater than the first preset temperature, and if the temperatures sensed by the plurality of temperature sensors are less than the third preset temperature and greater than the first preset temperature, the control unit maintains the plurality of fans to rotate at a low speed, wherein the third preset temperature is less than the second preset temperature.

3. The temperature adjusting apparatus according to claim 1, further comprising a valve, disposed at the air outlet, wherein the control unit further determines whether the temperatures sensed by the plurality of temperature sensors are less than a threshold temperature, and if the temperatures sensed by the plurality of temperature sensors are less than the threshold temperature, the control unit closes the valve, wherein the threshold temperature is less than or equal to the first preset temperature.

4. The temperature adjusting apparatus according to claim 1, wherein a first air circulation space is formed between the frame and the air inlet, and a second air circulation space is formed between the frame and the air outlet.

* * * * *